(12) United States Patent
Han et al.

(10) Patent No.: US 11,424,629 B1
(45) Date of Patent: Aug. 23, 2022

(54) BATTERY CHARGING AND DISCHARGING CIRCUIT AND TERMINAL DEVICES

(71) Applicant: Halo Microelectronics Co., Ltd., Foshan (CN)

(72) Inventors: Shuang Han, Foshan (CN); Fan Zhang, Foshan (CN); Songnan Yang, Frisco, TX (US)

(73) Assignee: Halo Microelectronics Co., Ltd., Foshan (CN)

( * ) Notice: Subject to any disclaimer, the term of this patent is extended or adjusted under 35 U.S.C. 154(b) by 0 days.

(21) Appl. No.: 17/690,655

(22) Filed: Mar. 9, 2022

(30) Foreign Application Priority Data

Oct. 25, 2021 (CN) .......................... 202111241341.4

(51) Int. Cl.
| | | |
|---|---|---|
| *H02J 7/00* | (2006.01) | |
| *H01M 50/51* | (2021.01) | |
| *H01M 10/44* | (2006.01) | |
| *H02M 3/158* | (2006.01) | |
| *G01R 19/00* | (2006.01) | |

(52) U.S. Cl.
CPC ......... *H02J 7/0014* (2013.01); *H01M 10/441* (2013.01); *H01M 50/51* (2021.01); *H02J 7/0063* (2013.01); *H02J 7/00712* (2020.01); *H02M 3/1582* (2013.01); *G01R 19/0046* (2013.01); *H02J 7/0029* (2013.01); *H02J 2207/20* (2020.01)

(58) Field of Classification Search
CPC ............... H01M 10/441; H01M 50/51; H01M 2010/4271; H02J 7/0063; H02J 7/00712; H02J 7/0014; H02J 7/0016; H02J 7/0018; H02J 7/0019; H02M 3/1582; B60L 11/1866; B60L 58/22
USPC ........................................................ 320/118
See application file for complete search history.

(56) References Cited

U.S. PATENT DOCUMENTS 5,659,237 A * 8/1997 Divan ..................... B60L 58/15
320/DIG. 13
5,905,360 A * 5/1999 Ukita ..................... B60L 58/20
320/121

(Continued)

FOREIGN PATENT DOCUMENTS

| CN | 108718103 A | 10/2018 |
|---|---|---|
| CN | 208369264 U | 1/2019 |

(Continued)

*Primary Examiner* — John T Trischler
(74) *Attorney, Agent, or Firm* — Slater Matsil, LLP

(57) ABSTRACT

A charging and discharging circuit includes a first conversion circuit and a second conversion circuit. The input terminal of the first conversion circuit is used to connect an external power supply. The output terminal of the first conversion circuit is connected to the input terminal of the second conversion circuit and the first terminal of a battery pack, and the second terminal of the battery pack is grounded. N battery cells have N-1 common nodes. Each common node is connected to a corresponding output terminal of the second conversion circuit. In the embodiment of the present application, the second conversion circuit effectively "transfers" the excess charge on the cell with a higher battery voltage in the battery pack to the cell with a lower voltage through the uneven distribution of the charging current.

11 Claims, 11 Drawing Sheets

(56) References Cited

U.S. PATENT DOCUMENTS

| | | | | |
|---|---|---|---|---|
| 6,150,795 A * | 11/2000 | Kutkut | H02J 7/0018 | 320/118 |
| 6,465,913 B1 * | 10/2002 | Nagai | H02J 7/0068 | 307/85 |
| 7,009,364 B2 * | 3/2006 | Stanesti | H02J 7/34 | 320/135 |
| 7,245,108 B2 * | 7/2007 | Chertok | B60L 58/18 | 320/132 |
| 7,352,154 B2 * | 4/2008 | Cook | B60L 1/00 | 320/118 |
| 7,489,110 B2 * | 2/2009 | Stanesti | H02J 7/0025 | 320/135 |
| 7,579,842 B2 * | 8/2009 | Hunter | H02J 7/0047 | 324/426 |
| 7,705,490 B2 * | 4/2010 | Srinivasan | H02M 7/497 | 307/77 |
| 7,791,313 B2 * | 9/2010 | Stanesti | H02J 7/0027 | 320/116 |
| 8,330,418 B2 * | 12/2012 | Furukawa | H02J 7/0018 | 320/118 |
| 8,354,825 B2 * | 1/2013 | Lee | H02J 7/0018 | 320/120 |
| 8,436,582 B2 * | 5/2013 | Pigott | H02J 7/0018 | 320/118 |
| 9,083,189 B2 * | 7/2015 | Wang | H02J 7/0018 | |
| 9,270,132 B2 * | 2/2016 | Yun | H02J 7/0063 | |
| 9,300,166 B2 * | 3/2016 | Kim | H02J 7/04 | |
| 9,401,606 B2 * | 7/2016 | Murray | H02J 7/0016 | |
| 9,478,995 B2 * | 10/2016 | Hayakawa | H02J 7/0016 | |
| 9,537,329 B2 * | 1/2017 | Pernyeszi | H02J 7/0014 | |
| 9,620,969 B2 * | 4/2017 | Kobayashi | B60L 58/22 | |
| 9,997,931 B2 * | 6/2018 | Mercier | H02J 7/0019 | |
| 10,214,111 B2 * | 2/2019 | Hand, III | B60L 15/007 | |
| 10,320,223 B2 * | 6/2019 | Onishi | H02J 7/042 | |
| 10,374,447 B2 * | 8/2019 | Deboy | H02J 7/00712 | |
| 10,393,818 B2 * | 8/2019 | Din | H02J 7/0014 | |
| 10,848,098 B2 * | 11/2020 | Agarwal | H02J 3/46 | |
| 10,875,421 B2 * | 12/2020 | Ichikawa | H02J 3/322 | |
| 11,290,027 B1 * | 3/2022 | Han | H02J 7/02 | |
| 2004/0135546 A1 * | 7/2004 | Chertok | B60L 58/18 | 320/118 |
| 2005/0017682 A1 * | 1/2005 | Canter | H02J 7/0016 | 320/118 |
| 2005/0168194 A1 * | 8/2005 | Stanesti | H02J 7/0068 | 320/134 |
| 2006/0152197 A1 * | 7/2006 | Stanesti | H02J 7/0027 | 320/135 |
| 2006/0193095 A1 * | 8/2006 | Hunter | H02J 7/0047 | 361/64 |
| 2008/0278968 A1 * | 11/2008 | Srinivasan | H02M 7/497 | 307/77 |
| 2008/0280175 A1 * | 11/2008 | Gurunathan | H02M 7/497 | 429/432 |
| 2009/0206795 A1 * | 8/2009 | Stanesti | H02J 7/0068 | 320/135 |
| 2010/0207579 A1 * | 8/2010 | Lee | H02J 7/0018 | 320/120 |
| 2011/0062795 A1 * | 3/2011 | Srinivasan | H02M 7/497 | 307/151 |
| 2011/0234164 A1 * | 9/2011 | Furukawa | H02J 7/0018 | 320/118 |
| 2012/0007558 A1 * | 1/2012 | Pigott | H02J 7/0018 | 320/118 |
| 2012/0043923 A1 * | 2/2012 | Ikriannikov | H02J 7/0014 | 307/82 |
| 2012/0062038 A1 * | 3/2012 | Wang | H02J 7/0018 | 307/82 |
| 2013/0099579 A1 * | 4/2013 | Murray | H02J 7/0018 | 307/82 |
| 2014/0042815 A1 * | 2/2014 | Maksimovic | H02J 1/102 | 307/63 |
| 2014/0152100 A1 * | 6/2014 | Lim | H02J 3/32 | 307/18 |
| 2014/0266051 A1 * | 9/2014 | Hayakawa | H02J 7/0019 | 320/118 |
| 2014/0266069 A1 * | 9/2014 | Deboy | H02J 7/00712 | 320/137 |
| 2014/0300194 A1 * | 10/2014 | Carcouet | H02J 7/0014 | 307/77 |
| 2014/0347013 A1 * | 11/2014 | Kim | H02J 7/0022 | 320/134 |
| 2014/0354236 A1 * | 12/2014 | Kim | H02J 7/007182 | 320/134 |
| 2015/0035360 A1 * | 2/2015 | Marbach | H02J 3/28 | 307/23 |
| 2015/0357843 A1 * | 12/2015 | Kobayashi | H02J 7/0018 | 320/118 |
| 2016/0064969 A1 * | 3/2016 | Pernyeszi | H02J 7/0014 | 320/118 |
| 2016/0197498 A1 * | 7/2016 | Mercier | H02J 7/007 | 320/118 |
| 2016/0261007 A1 * | 9/2016 | Furukawa | G01R 31/52 | |
| 2017/0047740 A1 * | 2/2017 | Narla | H02J 7/0068 | |
| 2017/0047741 A1 * | 2/2017 | Narla | H02M 7/00 | |
| 2017/0047742 A1 * | 2/2017 | Narla | H02J 7/35 | |
| 2017/0163160 A1 * | 6/2017 | Din | H02J 7/0018 | |
| 2017/0237276 A1 * | 8/2017 | Onishi | H02J 50/12 | 320/108 |
| 2017/0338519 A1 * | 11/2017 | Junger | H01M 10/425 | |
| 2018/0050597 A1 * | 2/2018 | Hand, III | H02J 7/0019 | |
| 2018/0056808 A1 * | 3/2018 | Gibson | H02J 7/0048 | |
| 2018/0167028 A1 * | 6/2018 | Agarwal | H02S 40/38 | |
| 2018/0248385 A1 * | 8/2018 | Zhang | H02J 7/0071 | |
| 2020/0207219 A1 * | 7/2020 | Slepchenkov | B60L 58/21 | |
| 2021/0078436 A1 * | 3/2021 | Ichikawa | H02J 3/322 | |
| 2021/0159710 A1 * | 5/2021 | Furukawa | H02J 7/0016 | |
| 2021/0359606 A1 * | 11/2021 | Han | H02M 1/0058 | |
| 2022/0069610 A1 * | 3/2022 | Zhang | H02M 1/0058 | |
| 2022/0094277 A1 * | 3/2022 | Han | H02M 7/219 | |
| 2022/0115879 A1 * | 4/2022 | Kahn | H02J 7/0063 | |
| 2022/0149644 A1 * | 5/2022 | Liu | H02J 7/345 | |

FOREIGN PATENT DOCUMENTS

| | | |
|---|---|---|
| CN | 109802466 A | 5/2019 |
| CN | 110289640 A | 9/2019 |
| CN | 211296233 U | 8/2020 |
| CN | 112737319 A | 4/2021 |
| EP | 3316440 A1 | 5/2018 |

* cited by examiner

BATTERY CHARGING AND DISCHARGING CIRCUIT AND TERMINAL DEVICES

PRIORITY CLAIM

This application claims the benefit of and priority to Chinese Patent Application No. 202111241341.4, filed on Oct. 25, 2021, which is hereby incorporated by reference in its entirety.

TECHNICAL FIELD

The invention relates to the field of battery charging, in particular to a battery charging and discharging circuit and terminal devices.

BACKGROUND

In some terminal devices such as smart phones, multiple battery cells are often connected in series to supply power to the device. However, due to the inherent inconsistency between battery cells, the internal impedance and discharge rate of each battery cell are inconsistent. During the charging and discharging processes of a battery pack, equalizing (or balancing) each battery cell to a common target parameter can help prolong battery life and maintain battery capacity.

Due to the integration and cost constraints, a passive battery cell balancing technique is widely used. Passive equalization usually uses resistors in parallel with battery cells to dissipate some of the energy in the cells, and battery cells with more energy will dissipate their excess energy until equalization is achieved between the battery cells.

However, the passive equalization is achieved through energy losses, which results in higher power losses.

SUMMARY

Embodiments of the present invention provide a battery charging and discharging circuit and terminal devices with low power losses.

In a first aspect, an embodiment of the present invention provides a battery charging and discharging circuit, and the battery charging and discharging circuit is used for charging and discharging of a battery pack. The battery pack includes N battery cells connected in series.

The charging and discharging circuit include a first conversion circuit and a second conversion circuit.

The input terminal of the first conversion circuit is used to connect to an external power supply, and the output terminal of the first conversion circuit is connected to the input terminal of the second conversion circuit and the first terminal of the battery pack. The second terminal of the said battery pack is grounded.

The N battery cells have N-1 common nodes, and the common nodes are the common connection points of two adjacent battery cells.

The second conversion circuit has N-1 output terminals. The step-down ratio of the second conversion circuit is a fixed value. The Mth output terminal is used to output the input voltage of M/N, and the first output terminal is also used to supply power to the load.

Each one of the common nodes of the N battery cells, in the order from the second terminal to the first terminal of the battery pack, is connected to one of the output terminals of the second conversion circuits from a low voltage to a high voltage. N is greater than or equal to 2.

In some embodiments, the charging and discharging circuit further includes a first controllable switch, and each common node of the N battery cells is connected to an output terminal of the second conversion circuit through the first controllable switch.

In some embodiments, the battery pack includes a first and a second battery cell connected in series, the first and second cells having a first common node. The second conversion circuit has a first output terminal. The step-down ratio of the second conversion circuit is 2:1. The first output terminal is used to output ½ of the input voltage, and the first output terminal is connected to the first common node via a first controllable switch. The first output terminal is also used for connecting a load. The first output terminal is used to supply power to the load.

In some embodiments, the battery pack includes a first battery cell, a second battery cell, and a third battery cell connected in series. One terminal of the third cell is grounded, and the third cell and the second cell are connected in series. The third cell and the second cell have a first common node. The second cell and the first cell have a second common node. The second conversion circuit has a first output terminal and a second output terminal. The step-down ratio of the second conversion circuit is 3:1. The first output terminal is used to output ⅓ of the input voltage. The second output terminal is used to output ⅔ of the input voltage. The first output terminal is connected to the first common node through a first controllable switch, and the second output terminal is connected to the second common node through another first controllable switch. The first output terminal is also used for connecting a load. The first output terminal is used to supply power to the load.

In some embodiments, the control terminal of the first controllable switch is connected to a first controller, and the first controller is used to control the first controllable switch to turn on or turn off the common node connection with the output of the second conversion circuit.

In some embodiments, the first controller is used to do the following: when the external power source does not provide power to the battery pack and the battery pack is in a discharging state, if the output current of the second conversion circuit is less than a preset current threshold, the first controller is used to control the first controllable switch to be turned on; when the voltage difference between the cells is smaller than a preset threshold, the second conversion circuit is turned off, and when the voltage difference between the cells is greater than or equal to the preset threshold, the second conversion circuit is activated.

In some embodiments, the first controller is used to do the following: when the battery pack is in a constant current charging state, the first controller is used to control the first controllable switch to be turned on.

In some embodiments, the first controller is used to do the following: when the battery pack is in a pre-charge state, the first controller is used to control the first controllable switch to be turned off.

In some embodiments, the first controller is used to do the following: when the battery pack is in a constant voltage charging state, the first controller is used to control the first controllable switch to be turned on.

In some embodiments, controlling the first controllable switch to be turned on includes the following: when the first controllable switch is switched from the off state to the on state, the first controllable switch is initially controlled to work in a constant current conduction mode; when the voltage difference between the two terminals of the first controllable switch is less than a predetermined value, the first controllable switch is controlled to be in a fully conducting state.

In some embodiments, the first controllable switch includes an isolating switch and a current measuring unit for measuring the current flowing through the isolating switch.

In a second aspect, an embodiment of the present invention provides a terminal device. The terminal device includes the above-mentioned battery charging and discharging circuit.

Compared with the prior art, the present invention has at least the following beneficial effects: the second conversion circuit in the embodiment of the present invention adopts a conversion circuit whose step-down ratio is a fixed value, and its output terminal can output several outputs with a preset ratio of the input voltage. The output terminal of the second conversion circuit is connected to the common node of the corresponding battery cell. When each battery cell is balanced, the voltage of the output terminal of the second conversion circuit and the corresponding common node are approximately the same. When the cell voltages are unbalanced, a current exists between the output terminal of the second conversion circuit and the corresponding common node, so that the charging currents of the series-connected cells are unequal until the battery voltages of the series-connected cells are balanced.

In the embodiment of the present application, the second conversion circuit effectively "transfers" the excess charge on the cell with a higher battery voltage in the battery pack to the cell with a lower voltage through the uneven distribution of the charging current, hence reducing power loss when compared to the method of consuming excess energy in a battery cell through resistors.

DETAILED DESCRIPTION OF ILLUSTRATIVE EMBODIMENTS

Figure 1:
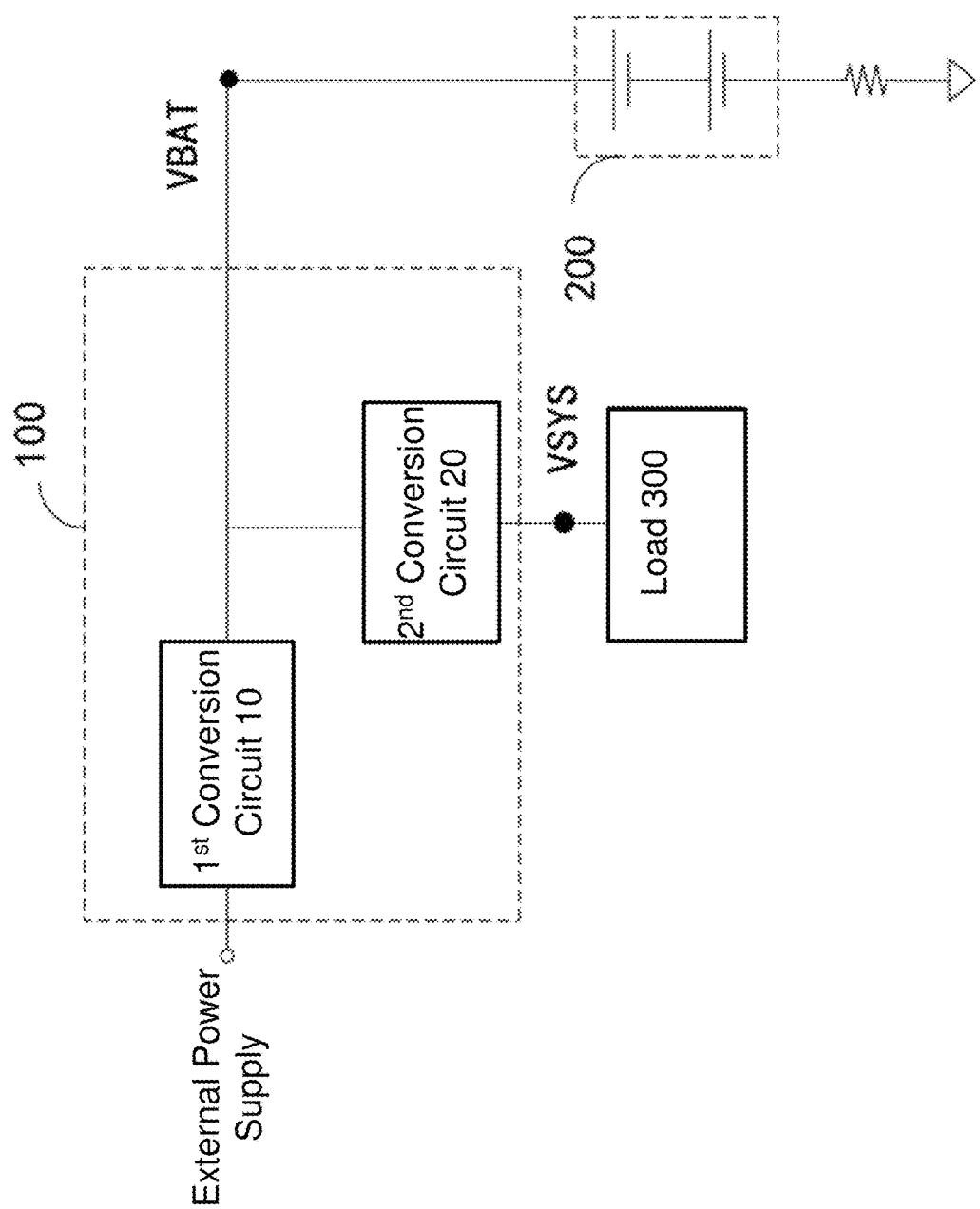
FIG. 1 is a schematic diagram of a battery charging and discharging circuit.

In order to make the objectives, technical solutions and advantages of the present invention clearer, the present invention will be further described in detail below with reference to the accompanying drawings and embodiments. It should be understood that the specific embodiments described herein are only used to explain the present invention, but not to limit the present invention. Based on the embodiments of the present invention, all other embodiments obtained by those of ordinary skill in the art without creative efforts shall fall within the protection scope of the present invention.

It should be noted that, if there is no conflict, various features in the embodiments of the present invention can be combined with each other, which are all within the protection scope of the present invention. In addition, although the functional modules are divided in the schematic diagram of the device, and the logical sequence is shown in the flowchart, in some cases, the modules in the device may be divided differently, the described steps or the sequence shown in the flowchart may be performed differently. Furthermore, the words "first", "second" and "third" used in the present invention do not limit the data and execution order, but only distinguish the same or similar items with basically the same function and effect.

One or more embodiments are exemplified by the pictures in the corresponding drawings, and these exemplifications do not constitute limitations of the embodiments, and elements with the same reference numerals in the drawings are denoted as similar elements. Unless otherwise stated, the figures in the accompanying drawings do not constitute a scale limitation.

Connecting batteries in series increases the battery capacity by doubling the battery voltage, which can avoid the problems of high input current and high power consumption caused by single-cell batteries or parallel-connected batteries under the same battery charging power. Terminal devices often uses a battery pack composed of series-connected cells to increase the battery capacity to meet the required running time between charges of the terminal devices.

FIG. 1 shows a charging and discharging circuit of a terminal device by taking two battery cells connected in series as an example. In the embodiment shown in FIG. 1, the battery pack 200 includes two battery cells connected in series. The charging and discharging circuit 100 includes a first conversion circuit 10 and a second conversion circuit 20. The input terminal of the first conversion circuit 10 is used to connect to an external power supply, and the output terminal of the first conversion circuit 10 is connected to the input terminal of the second conversion circuit 20 and the first terminal of the battery pack 200. The second terminal of the battery pack 200 is connected to ground. The output terminal VSYS of the second conversion circuit 20 is used to provide a supply voltage for a load 300.

The external power supply is used to provide the power supply. The first conversion circuit 10 is used to convert the input voltage of the external power supply into a charging voltage required by the battery pack to charge the battery pack. The second conversion circuit 20 is used for converting the battery terminal voltage VBAT to supply power to the load 300.

Due to the inherent inconsistency between the battery cells, the internal impedance and discharge rate of each battery cell will be inconsistent. During the charging and discharging processes of the battery pack, equalizing (or balancing) each cell to a common target parameter can help prolong battery life and maintain greater battery capacity.

Figure 2A:
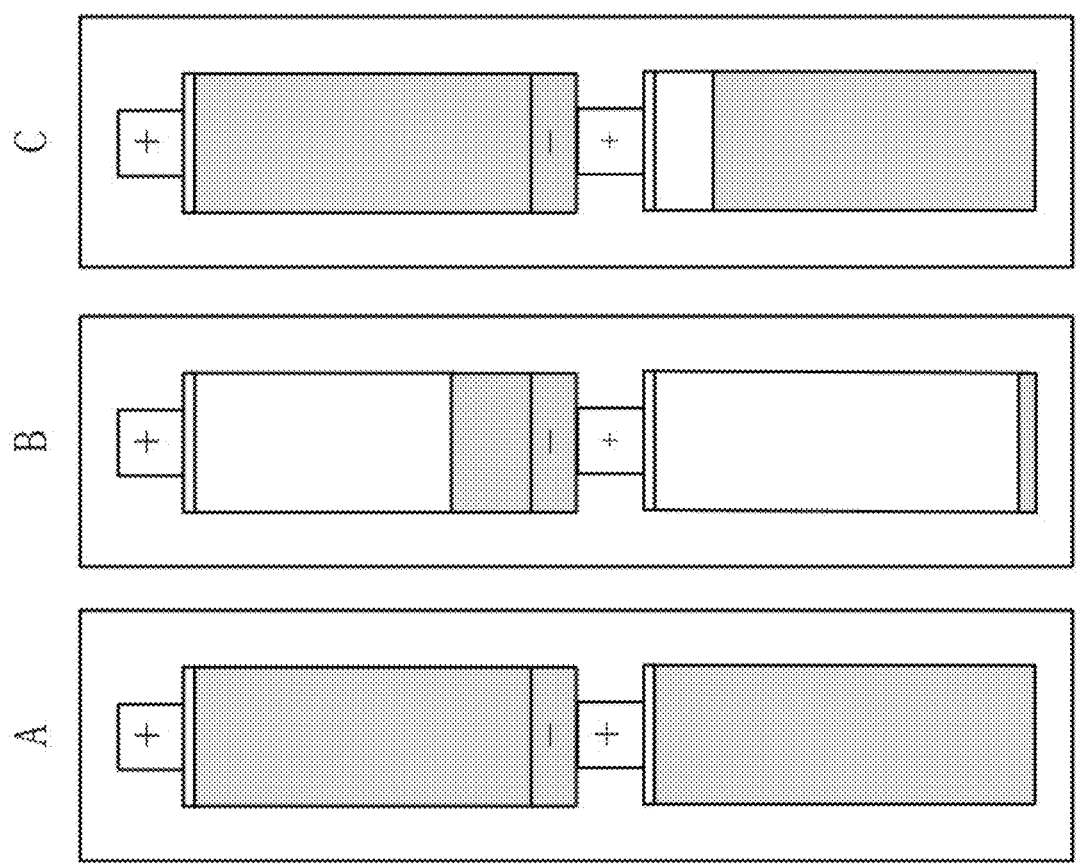
FIG. 2*a* and FIG. 2*b* are schematic diagrams of the charging and discharging states of a battery in a battery charging and discharging circuit.
Figure 2B:
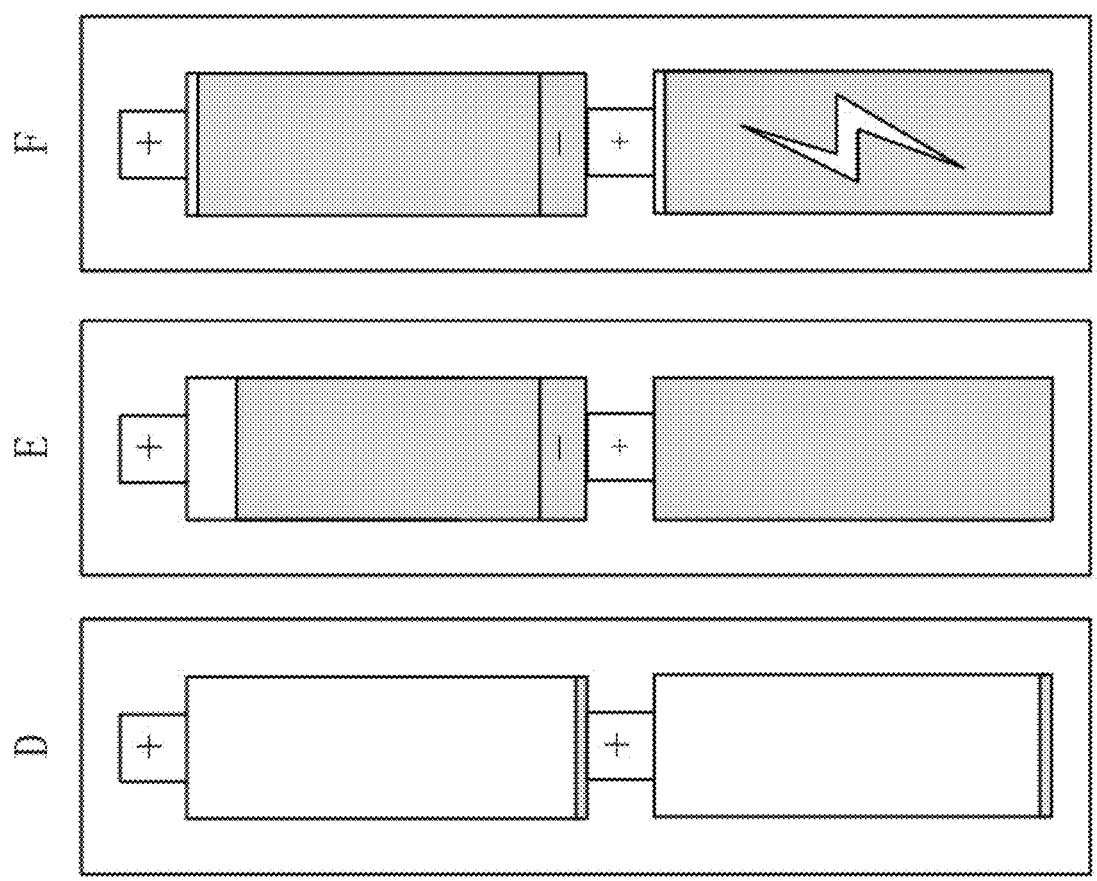

A-F in FIGS. 2*a* and 2*b* show the states of the battery at several charging and discharging stages. The battery pack in FIGS. 2*a* and 2*b* includes a battery cell 1 on the top and a battery cell 2 on the bottom. The state of health (SOH) of the cell 2 is worse than that of the cell 1 (For example, under the same battery voltage, the battery stores less electrical energy). This results in that even if the two cells in series are charged and discharged with the same current, their voltages increase and decrease at different rates.

Referring to FIG. 2a, in stage A, two battery cells connected in series have the same voltage and are discharged together in series. Since cell 2 is less healthy than cell 1, cell 2 discharges faster.

In stage B, after a period of series discharging, even though there is still energy in cell 1, the current stops when cell 2 is fully discharged. Then in the charging process, in phase C, since cell 1 starts charging with a non-zero capacity and is fully charged first, at this time, the charging process stops even if cell 2 itself is not fully charged. Unbalanced cells can reduce the capacity of the battery pack over time, because after the battery pack is recharged, the battery pack has less energy available than before it was discharged.

In another case, referring to FIG. 2b, it is assumed that the series-connected cells in the battery pack are initially in a fully discharged state as shown in stage D. During the charging process of the battery pack, due to the poor health of the battery cell 2, it will be fully charged first. As shown in stage E, when the battery cell 2 is fully charged, the battery cell 1 has not yet reached the full charge battery voltage. In this case, the unbalanced battery voltage also poses the risk of overcharging the battery. As shown in stage F, since the total voltage of the battery pack has not yet reached the total voltage when both cells are fully charged, if the battery pack continues to be charged, cell 2 will be applied with a voltage higher than when it is fully charged, resulting in overcharge, which further degrades the health of the battery cell 2.

In summary, the usable capacity of a battery pack is limited by the cell with the poorest health.

Figure 3:
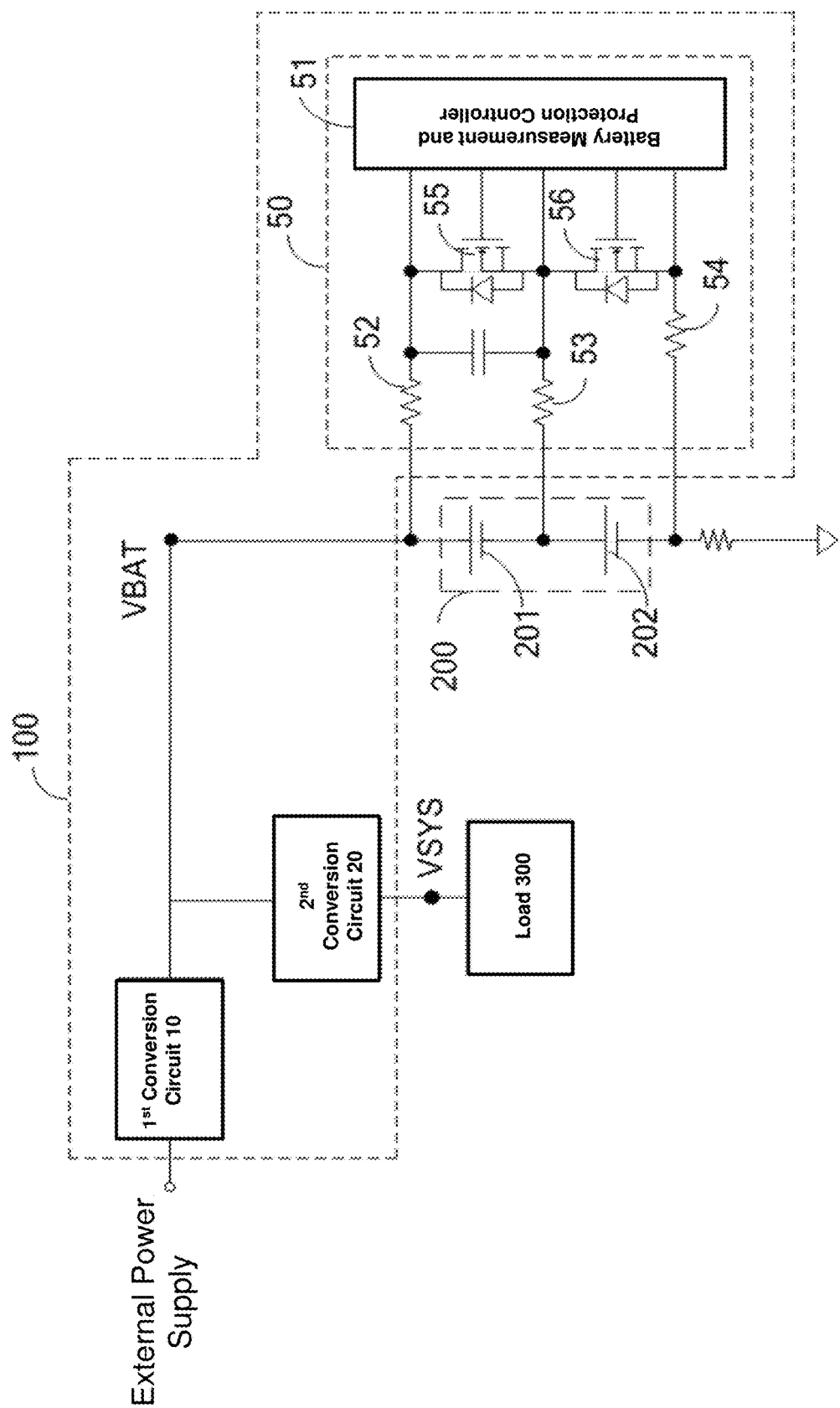
FIG. 3 is a schematic diagram of a battery charging and discharging circuit.

Because the active balance of battery cells requires more active and passive devices in the circuit, due to the constraints of integration and cost, the passive balance technique is widely used in consumer electronic products. FIG. 3 shows an implementation of battery balancing for a battery pack using the passive balance technique in a battery charging and discharging circuit.

Referring to FIG. 3, the charging and discharging circuit 100 further includes an equalization circuit 50. The equalization circuit 50 includes switches 55, 56, and resistors 52, 53, 54. The switch 55 is connected in series with the resistor 52 and the resistor 53. The series-connected 55, 52 and 53 are connected across the two terminals of the battery cell 201. The switch 56 is connected in series with the resistor 53 and the resistor 54. The series-connected 56, 53 and 54 are connected across the two terminals of the battery cell 202. These two series-connected circuits provide separate discharge paths for the two battery cells, respectively. The battery measurement and protection controller 51 is used to measure the voltage across each cell, and control the turn-on and turn-off of the switch 55 and the switch 56 to provide a discharge path for each battery cell.

During the charging process of the series-connected battery pack, when the voltage difference between the two cells exceeds a predetermined threshold, the battery measurement and protection controller 51 controls the switch corresponding to the battery cell with a higher voltage to turn on, so as to activate the corresponding switch on the discharge path of the battery cell until the voltage difference between the two battery cells is less than the predetermined threshold.

For example, when the battery measurement and protection controller 51 detects that the voltage of the battery cell 201 is higher than the voltage of the battery cell 202 and exceeds the preset voltage difference threshold, the battery measurement and protection controller 51 will activate the switch 55. The cell 201 is slowly discharged through the resistor 52 and the resistor 53 until the difference between the voltage of the cells 201 and the voltages of the cells 202 is smaller than the preset threshold, and the cell balancing is stopped.

Passive balancing is to achieve battery balancing by consuming the "excess" energy in the high-voltage cells in the battery pack, which brings more power consumption during the charging process of the battery pack, and this part of the power consumption does not offer any function. It only increases the thermal burden of the terminal device. Passive balancing does not solve the problem that the run time of the battery pack is determined by the cells with poor battery health while the battery is discharging.

Figure 4:
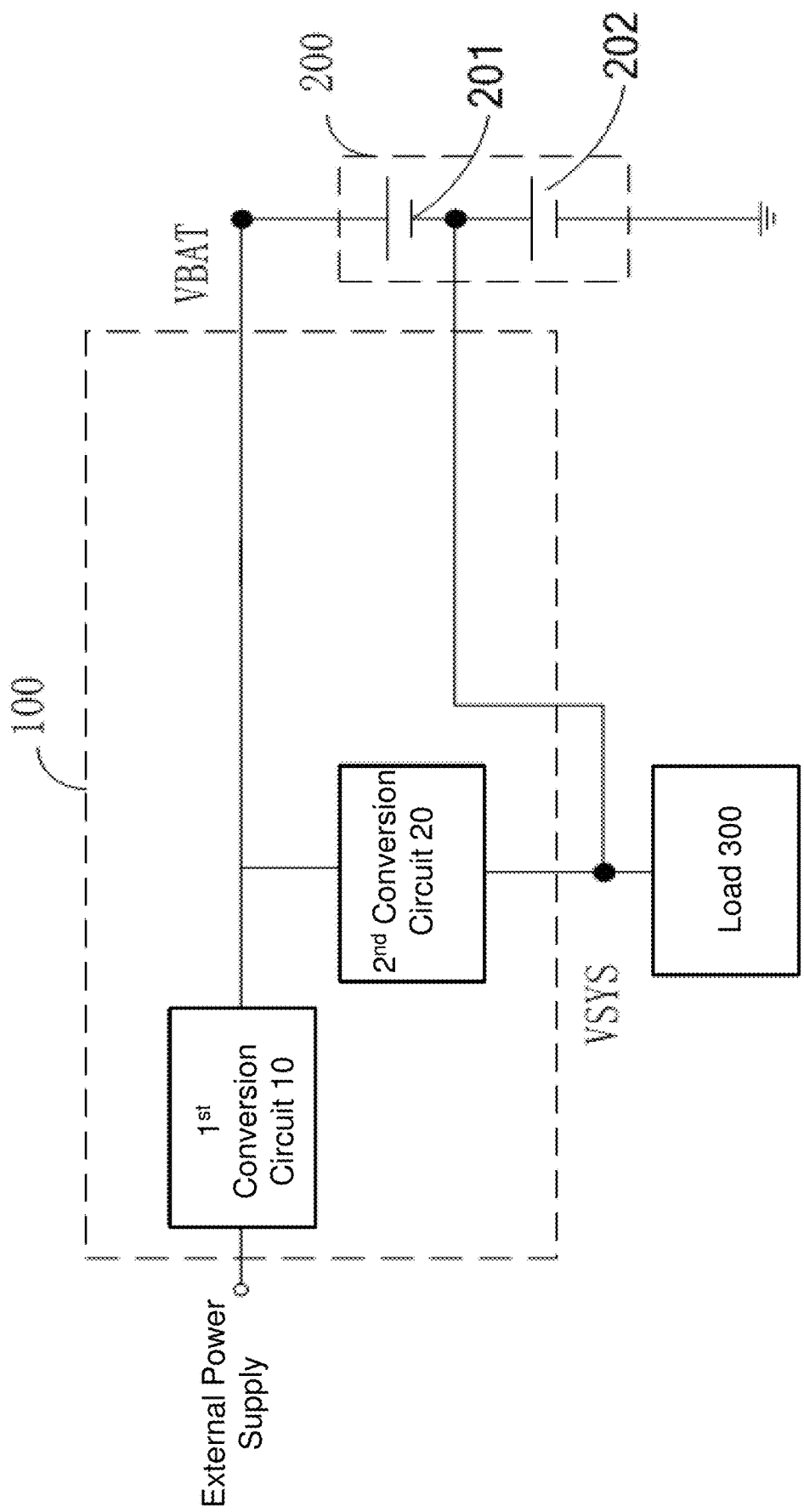
FIG. 4 is a schematic diagram of a battery charging and discharging circuit provided by an embodiment of the present invention.

FIG. 4 shows another battery balancing method of the battery charging and discharging circuit by taking a battery pack with two cells connected in series as an example. The second conversion circuit 20 adopts a voltage conversion circuit with a fixed step-down ratio, such as a charge pump circuit. The second conversion circuit 20 supplies power to the system load by making the second conversion circuit output a voltage with a fixed step-down ratio. At the same time, the output of the second conversion circuit is connected with the common node of adjacent cells in the battery pack to achieve cell balancing.

If the battery pack has N cells connected in series, there are N-1 common nodes, and the common nodes are the common connection points of two adjacent cells. The second conversion circuit has N-1 output terminals. The Mth output terminal is used to output the M/Nth of the input voltage. For example, the first output terminal is used to output a voltage equal to 1/Nth of the input voltage, and the second output terminal is used to output a voltage equal to 2/Nth of the input voltage. The first output terminal is also used to supply power to the system load.

Each of the common nodes of the battery pack (in the order from the second terminal to the first terminal of the battery pack) is connected to one output terminal of the second conversion circuit (in the order from a low voltage to a high voltage). N is an integer. N is greater than or equal to 2.

For example, in the embodiment shown in FIG. 4, the battery pack 200 includes a first cell 201 and a second cell 202 connected in series. The second conversion circuit 20 has a first output terminal VSYS, which outputs ½ of the input voltage. The first output terminal VSYS is connected to the first common node of the common connection point of the two battery cells. In this embodiment, the second conversion circuit 20 may adopt a voltage conversion circuit with a fixed step-down ratio of 2:1, such as a charge pump circuit with a step-down ratio of 2:1.

Figure 5:
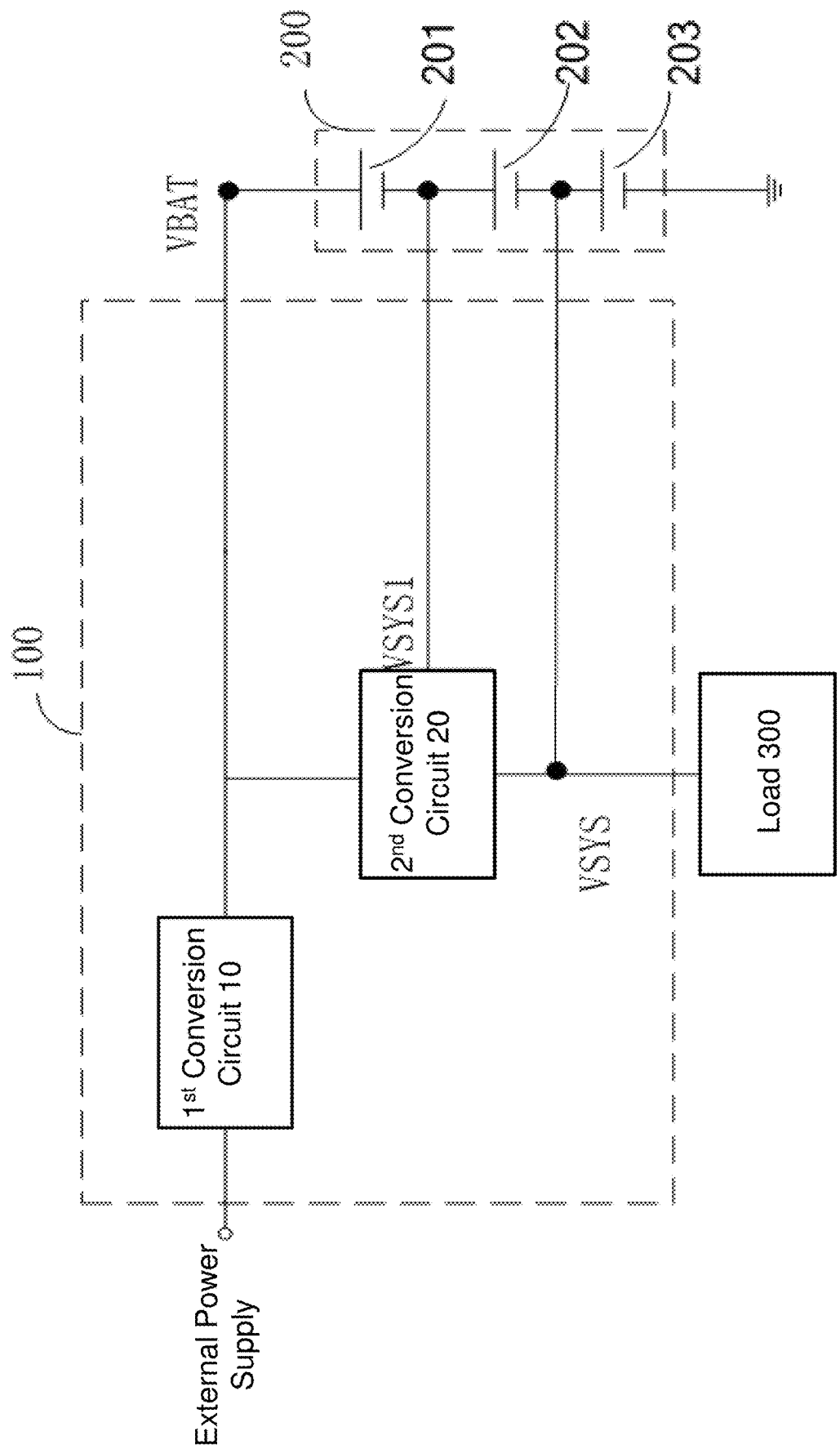
FIG. 5 is a schematic diagram of another battery charging and discharging circuit provided by an embodiment of the present invention.

For another example, in the embodiment shown in FIG. 5, the battery pack 200 includes a first battery cell 201, a second battery cell 202 and a third battery cell 203 connected in series. The second conversion circuit 20 has two output terminals. The first output terminal VSYS is used to output ⅓ of the input voltage. The second output terminal VSYS1 is used to output ⅔ of the input voltage. The first output terminal VSYS is also used to supply power to the load 300. The first output terminal VSYS is connected to the first common node of the second cell 202 and the third cell 203. The second output terminal VSYS1 is connected to the second common node of the second cell 202 and the first cell 201. In this embodiment, the second conversion circuit 20 may use a voltage conversion circuit with a fixed step-down ratio of 3:1, such as a charge pump circuit with a step-down ratio of 3:1.

In other embodiments, in order to facilitate the control of battery balancing, the charge-discharge circuit 100 further includes a first controllable switch 30. Each common node in the battery pack is connected to an output terminal of the second conversion circuit 20 through the first controllable switch 30.

Figure 6:
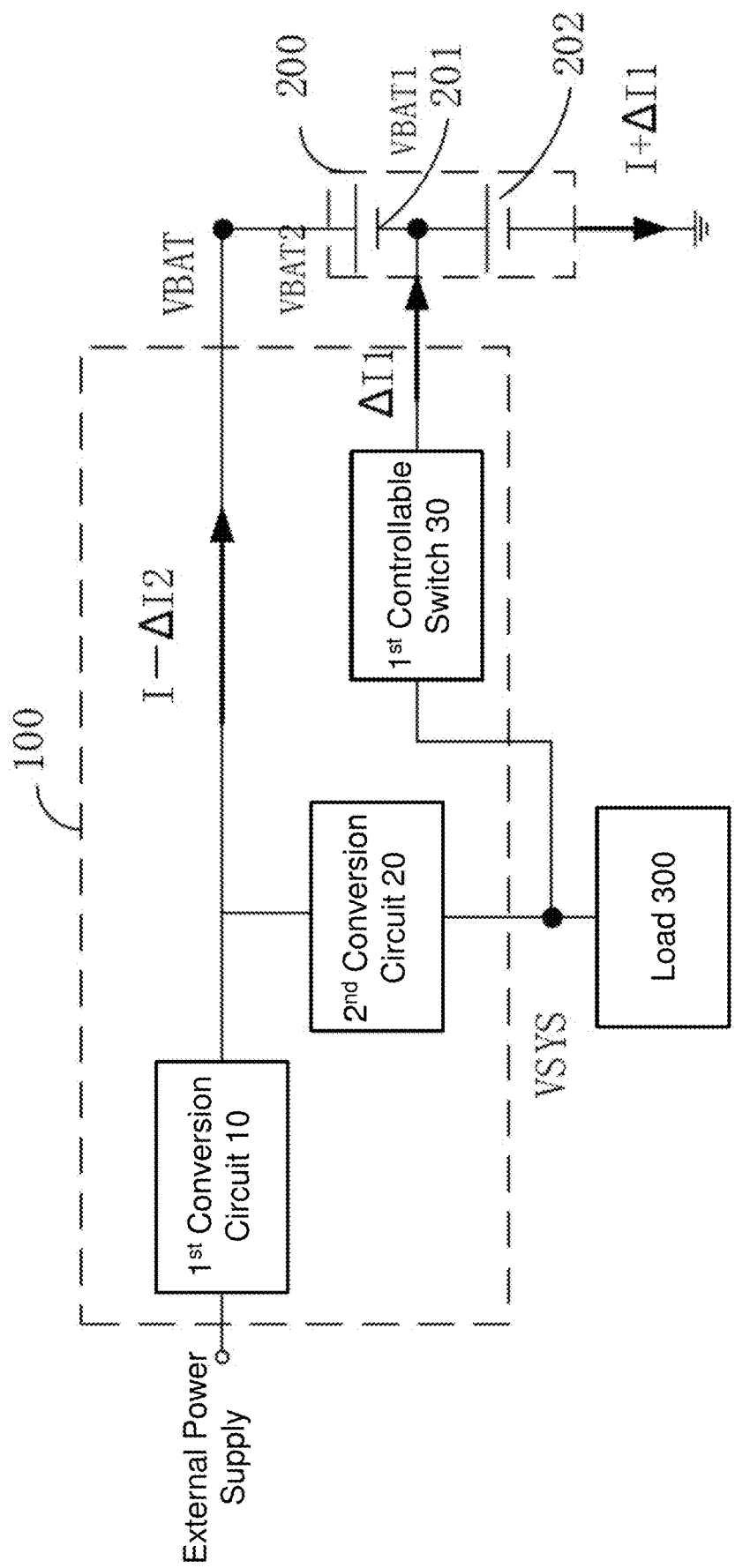
FIG. 6 is a schematic diagram of another battery charging and discharging circuit provided by an embodiment of the present invention.

For example, in the embodiment shown in FIG. 6, the first output terminal VSYS is connected to the first common node of the two cells through the first controllable switch 30. In the embodiment shown in FIG. 7, the first output terminal VSYS is connected to the first common node of the second cell 202 and the third cell 203 through the first controllable switch 30, and the second output terminal VSYS1 is connected to the second common node of the first cell 201 and the second cell 202 through another first controllable switch 30.

Figure 7:
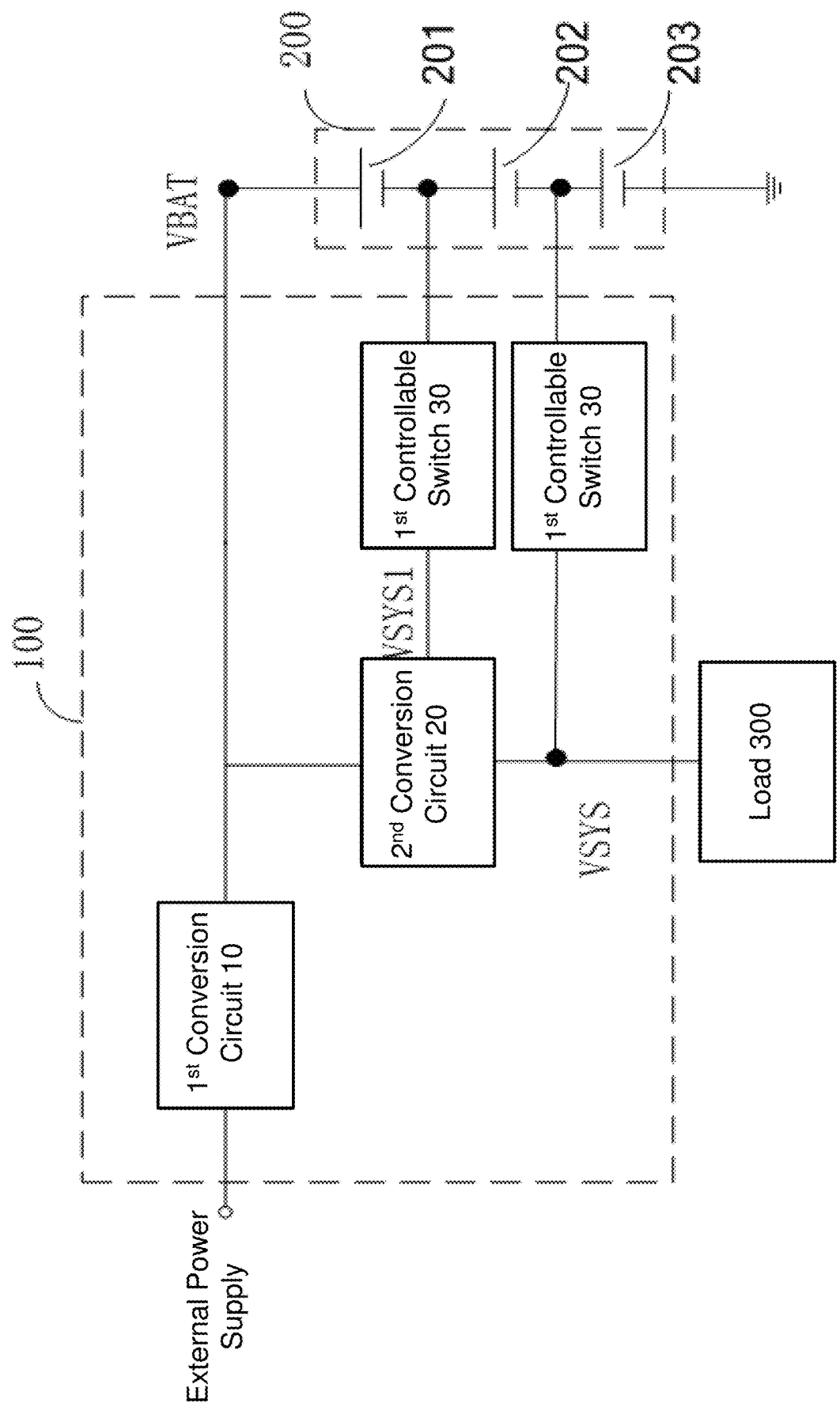
FIG. 7 is a schematic diagram of another battery charging and discharging circuit provided by an embodiment of the present invention.

In this balancing battery charging and discharging circuit, please refer to FIG. 6 and FIG. 7 respectively, the input terminal of the first conversion circuit 10 is used to connect an external power source. The output terminal of the first conversion circuit 10 is connected to the second conversion circuit 20 and the input terminal of the battery pack 200. The second terminal of the battery pack 200 is grounded. Each output terminal of the second conversion circuit 20 is connected to each common node of the battery pack through a corresponding first controllable switch 30.

In some embodiments, the external power supply is, for example, the power supply voltage output by a power adapter. The first conversion circuit 10 may be any suitable voltage conversion circuit, such as a buck-boost switching conversion circuit. The first controllable switch 30 can be any suitable switch device that can realize the function of turning on and off the circuit by controlling its control terminal. For example, it can be a bidirectional isolation switch composed of two back-to-back connected field effect transistors (MOSFETs), or a MOSFET switch structure with switchable body diodes (e.g., isolation switch 30 shown in FIG. 8).

In operation, the conduction state of the first controllable switch 30 may be fully conducting, that is, the switch is equivalent to a small resistance, and the current flowing through the switch increases with the increase of the voltage difference between the two terminals of the switch. The conduction state of the first controllable switch 30 may also be a constant current (current limiting) conduction state, that is, the switch is equivalent to a constant current source, and the current flowing through the switch is constant and does not change with the voltage difference between the two terminals of the switch. Taking a MOSFET switch as an example, the constant current conduction state can be achieved by controlling the bias voltage between its gate and source to operate in the saturation region.

The second conversion circuit 20 may be a voltage conversion circuit with a fixed step-down ratio, such as a charge pump circuit. The second conversion circuit 20 is composed of a power conversion module and a second controller. The second controller controls a plurality of power conversion modules in the power conversion circuit. The turn-on and turn-off of the switch realizes the step-down function of a fixed rate.

The input of the second conversion circuit 20 may be the output of the first conversion circuit 10. When the system is discharging without connecting to an external power source, the input of the second conversion circuit 20 is the voltage of the battery pack. In other occasions, where fast charging is supported, the input voltage of the second conversion circuit 20 can also be directly provided by an external power source (for example, the input voltage of the second conversion circuit 20 in FIG. 8 can be directly provided by the external power source through the load switch 80).

Figure 8:
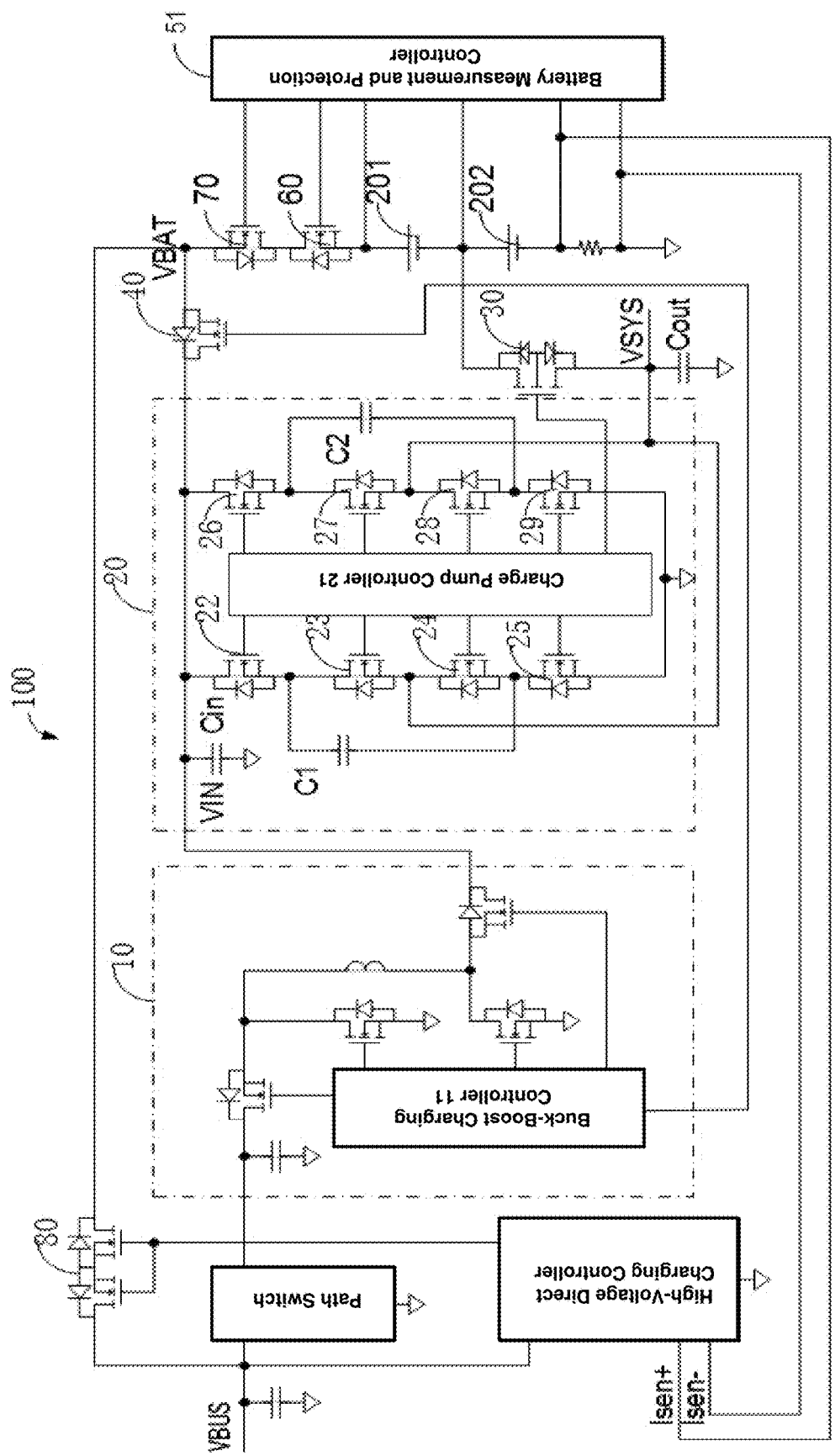
FIG. 8 is a schematic diagram of another battery charging and discharging circuit provided by an embodiment of the present invention.

FIG. 8 shows a circuit schematic diagram of the first conversion circuit 10 and the second conversion circuit 20. In this embodiment, the second conversion circuit 20 is a charge pump circuit with a step-down ratio of 2:1. The 2:1 power conversion module comprises a first set of four switches (switch 22, switch 23, switch 24, switch 25) and a second set of four switches (switch 26, switch 27, switch 28, switch 29) connected in series between VIN and ground. The 2:1 power conversion module further comprises a flying capacitor C1, a flying capacitor C2, an input capacitor Cin and an output capacitor Cout. It is a dual-phase 2:1 step-down circuit. The second controller 21 is a charge pump controller. The charge pump controller 21 is used to control the on and off of each switch in the second conversion circuit 20.

The flying capacitor C1 is connected between the common node of switch 22 and switch 23 and the common node of switch 24 and switch 25. Flying capacitor C2 is connected between the common node of switch 26 and switch 27 and the common node of switch 28 and switch 29. The first output terminal VSYS is connected to the common node of switch 23 and switch 24, and the common node of switch 27 and switch 28.

The step-down principle of the 2:1 charge pump circuit is as follows: when the charge pump circuit operates in a step-down mode, the VIN port is the voltage input terminal. Assuming that the input voltage is Vin, the VSYS port is the voltage output terminal. Assuming that the output voltage is Vsys, the operating process can be divided into two phases of equal duration.

In the first phase, switches 22, 24, 27 and 29 are turned on, and switches 23, 25, 26 and 28 are turned off. On the one hand, the input voltage Vin charges the output capacitor Cout and the load on VSYS through the flying capacitor C1. On the other hand, the flying capacitor C2 is connected in parallel with the output capacitor Cout to supply power to the load on VSYS. In some embodiments, Vsys is equal to one-half of the input voltage Vin.

In the second phase, switches 23, 25, 26 and 28 are turned on, and switches 22, 24, 27 and 29 are turned off. On the one hand, the flying capacitor C1 and the output capacitor Cout are connected in parallel to supply power to the load on VSYS. On the other hand, the input voltage Vin charges the output capacitor Cout through the flying capacitor C2 and supplies power to the load on VSYS. In this way, the power conversion module repeatedly and rapidly switches between these two modes with a duty cycle of 50%, so that the output voltage Vsys is one-half of the input voltage Vin.

In other embodiments of the battery pack, which has more series-connected battery cells, the second conversion circuit 20 needs to be adjusted accordingly. For example, in the embodiment of the battery pack with three series-connected cells, the second conversion circuit 20 is a 3:1 step-down charge pump circuit converter, such as a 3:1 ladder charge pump step-down circuit.

Figure 9:
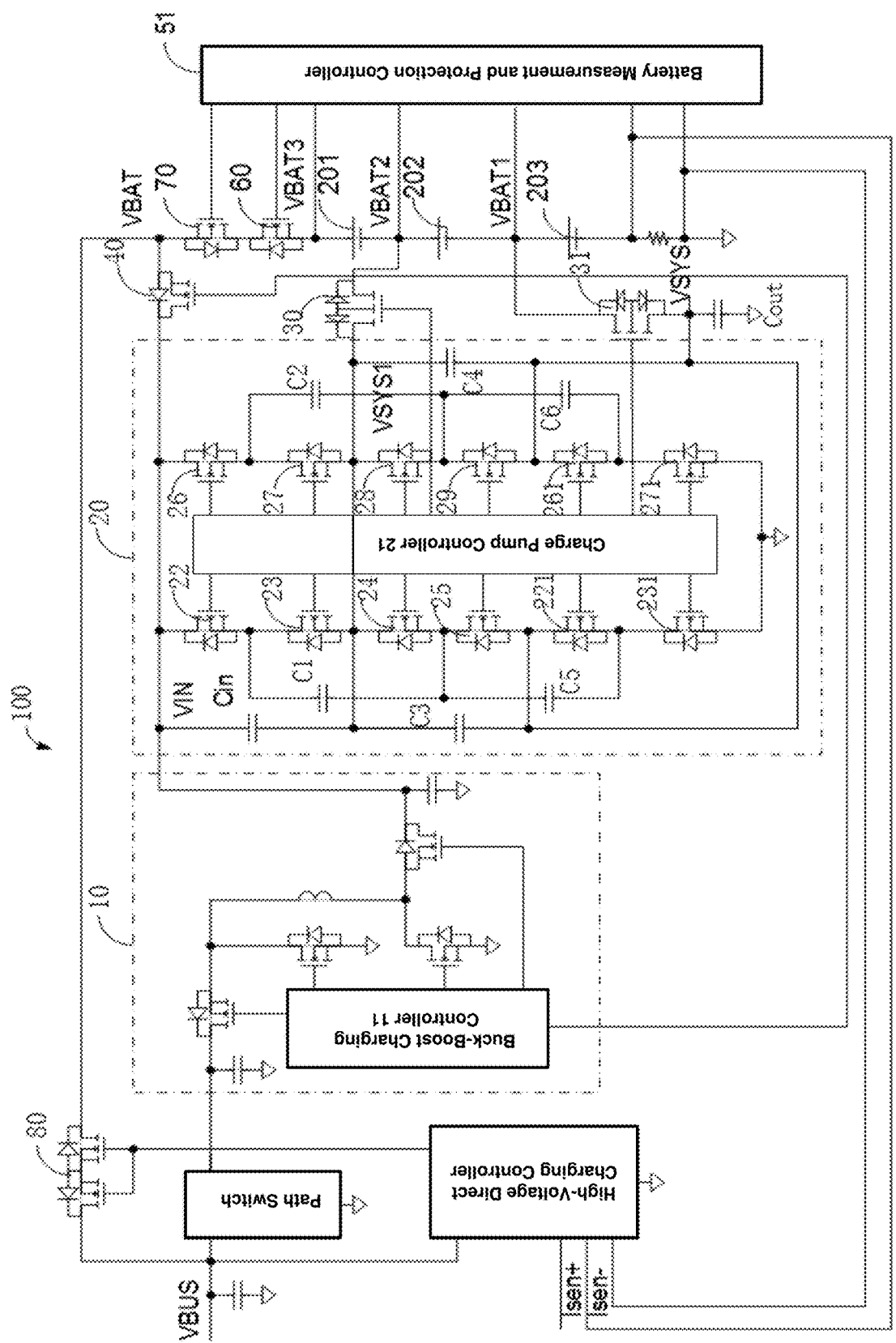
FIG. 9 is a schematic diagram of another battery charging and discharging circuit provided by an embodiment of the present invention.

As shown in FIG. 9, another schematic diagram of the second conversion circuit 20 is shown. In this embodiment, the second conversion circuit 20 is a charge pump circuit with a step-down ratio of 3:1. The 3:1 power conversion module comprises a first set of six switches (switch 22, switch 23, switch 24, switch 25, switch 221, switch 231) and a second set of six switches (switch 26, switch 27, switch 28, switch 29, switch 261, switch 271) connected in series between VIN and ground. The 3:1 power conversion module further comprises flying capacitor C1, flying capacitor C2, flying capacitor C3, flying capacitor C4, flying capacitor C5, flying capacitor C6, input capacitor Cin and the output capacitor Cout. It is a two-phase 3:1 step-down circuit.

The flying capacitor C1 is connected between the common node of switch 22 and switch 23, and the common node of switch 24 and switch 25. Flying capacitor C3 is connected between the common node of switch 23 and switch 24, and the common node of switch 25 and switch 221. Flying capacitor C5 is connected between the common node of switch 24 and switch 25, and the common node of switch 221 and switch 231.

Flying capacitor C2 is connected between the common node of switch 26 and switch 27, and the common node of switch 28 and switch 29. Flying capacitor C4 is connected between the common node of switch 27 and switch 28, and the common node of switch 29 and switch 261. Flying capacitor C6 is connected between the common node of switch 28 and switch 29, and the common node of switch 261 and switch 271. The first output terminal VSYS is connected to the common node of switch 29 and switch 261, and the common node of switch 25 and switch 221. The second output terminal VSYS1 is connected to the common node of switch 27 and switch 28, and the common node of switch 23 and switch 24.

The step-down principle of the 3:1 charge pump circuit is as follows: when the charge pump circuit operates in a step-down mode, the VIN port is the voltage input terminal. Assuming that the input voltage is Vin, the VSYS port is the first voltage output terminal. Assuming that the output voltage is Vsys. VSYS1 port is the second voltage output terminal. It is assumed that the output voltage is Vsys1. Its operating process can be divided into two phases of equal duration.

In the first phase, switches 22, 24, 221, 27, 29, and 271 are turned on, and switches 23, 25, 231, 26, 28, and 261 are turned off. On the on hand, Vin charges the output capacitor Cout charges and supplies power to the load on VSYS through the flying capacitors C1 and C5. On the other hand, the flying capacitor C6 is connected in parallel with the output capacitor Cout to supply power to the load on VSYS. In some embodiments, Vsys is equal to the voltage across the flying capacitors C1, C5 and C6, which is one-third of the input voltage Vin. Vsys1 is equal to two-thirds of Vin. At the same time, the flying capacitor C3 is connected in parallel with the flying capacitor C5. The flying capacitor C4 is connected in parallel with the flying capacitor C2, and the voltages across two terminals of the capacitors of C2, C3, C4, and C5 are equal to Vin/3.

In the second phase, switches 23, 25, 231, 26, 28, and 261 are turned on, and switches 22, 24, 221, 27, 29, and 271 are turned off. On the one hand, the flying capacitor C5 and the output capacitor Cout are connected in parallel to supply power to the load on VSYS. On the other hand, the input voltage Vin charges the output capacitor Cout and powers the load on VSYS through the series-connected flying capacitors C2, C4. At the same time, the flying capacitor C4 is connected in parallel with the flying capacitor C6. The flying capacitor C1 is connected in parallel with the flying capacitor C3. The voltages across both terminals of C1, C3, C4, and C6 are equal to Vin/3. In this way, the power conversion module has a 50% duty cycle between the two repeated and fast switching modes, which enables the output voltage Vsys to be one-third of the input voltage Vin, and Vsys1 to be two-thirds of Vin.

The first conversion circuit 10 includes a switching conversion circuit comprising four switches and an inductor, and a buck-boost charging controller 11. The buck-boost charging controller 11 controls the on and off of each switch in the first conversion circuit 10 to realize the up-conversion (boost) or down-conversion (buck) of the output voltage to meet the charging voltage and current requirements of the battery pack in different charging stages (such as pre-charging, constant current, constant voltage, etc.).

The control terminal of the first controllable switch 30 can be connected to a first controller (not shown in the figure), and the first controller controls the turning on and turning off of the first controllable switch 30 to turn on or off the connection between common nodes of the battery cells with the output terminals of the second conversion circuit.

In some of these embodiments, the control terminal of the first controllable switch 30 may be connected to a second controller, and the second controller controls the on and off of the first controllable switch 30. In this embodiment, the first controller is the second controller (e.g., the charge pump controller 21) in the second conversion circuit 20. In other embodiments, the first controllable switch 30 may also be controlled by other controllers. For example, the first controllable switch 30 may be controlled by the buck-boost charging controller 11 in the first conversion circuit 10 or a separately provided controller.

The battery charging and discharging circuit can supply power to the terminal device, then the battery pack 200 can be a battery in the terminal device, and the load 300 can be various functional devices in the terminal device that need power supply. Terminal devices are devices such as mobile phones, tablet computers, PCs, etc. The battery charging and discharging circuit is used for terminal device. The "system" referred to in the text is the terminal device system.

The balancing principle of the battery balancing method is described below by taking FIG. 6 and FIG. 7 as examples. In the embodiment shown in FIG. 6, the voltage across the cell 201 is set to be VBAT2, and the voltage across the cell 202 is set to be VBAT1.

When the state of charge of the battery is not balanced, the voltage across the two series connected cells will be different. Assuming VBAT1<VBAT2, since the second conversion circuit 20 is a voltage conversion circuit with a step-down ratio of 2:1, and the input voltage of the second conversion circuit 20 is VBAT, the output voltage of the second conversion circuit 20 is VSYS=½VBAT. Then, there is VBAT1<½VBAT=VSYS. At this time, a voltage difference will appear across the first controllable switch 30. When the first controllable switch 30 is turned on, a current ΔI1 flows from VSYS to VBAT1 to supplement power for the under-voltage cell 202 and increase the voltage at VBAT1.

When VBAT1 increases, the total voltage of the battery pack increases, causing the charging current I to decrease to become I-ΔI2. In this way, since VBAT1 is connected to VSYS, when the battery voltage is unbalanced, there will be a current between VSYS and VBAT1, so that the charging currents of the two cells in series are not equal until the voltages of the two cells are balanced.

In this process, no additional loss is generated. Furthermore, the second conversion circuit 20 effectively "transfers" the excess charge on the cell 201 to the cell 202 with a lower voltage through the uneven distribution of the charging current.

Similarly, when VBAT1 is higher than VSYS, there will be a current flowing from VBAT1 to VSYS, which increases VSYS, which in turn causes VBAT=2VSYS to increase, and finally increases the charging current I of the battery cells in series until VBAT1=VSYS=½VBAT=VBAT2, that is, the two cells are balanced.

In the embodiment shown in FIG. 7, the second conversion circuit 20 is a voltage conversion circuit with a step-down ratio of 3:1, and the input voltage of the second conversion circuit 20 is VBAT. The output voltage VSYS=⅓VBAT, and the output voltage VSYS1=⅔VBAT of the second output terminal.

Under the condition that each cell is balanced, the voltage of the first common node of the third cell 203 and the second cell 202 is ⅓VBAT, and the voltage at the second common node of the second cell 202 and the first cell 201 is ⅔VBAT.

When the cell voltages are not balanced, the voltage of the first common node is not equal to ⅓ VBAT, and the voltage of the second common node is not equal to ⅔ VBAT. A voltage difference will be generated between the two terminals of the two first controllable switches 30. When the first controllable switch 30 is turned on, there will be a current between VSYS and the first common node, and a current between VSYS1 and the second common node. The charging currents of the three cells in series are unequal until the voltages of the three cells are balanced.

This battery balancing method can achieve battery balancing in both the charging process and the discharging process, completely solving the problem of available capacity of the battery pack limited by the battery with poor health status. In the process of equalization, there is no additional power loss.

In the passive equalization method shown in FIG. 3, the switches 55 and 56 are often integrated in the battery measurement and protection controller 51, which limits its heat dissipation capability and further limits the on-resistance of the switches 55 and 56. Generally, the on-resistances of the switches 55 and 56 are several hundred ohms, and the resistances of the series-connected resistors 52-54 are also about 100 ohms. Therefore, during the battery balancing process, the total resistance of the series-connected discharge paths is about 500 ohms. Assuming that the voltage of the cells in the battery pack is 3.6V, the current equalized by the cells is 7.2mA. Assuming that the capacity of the cells 201 and 202 is 2000 mAh, and there is a 10% power imbalance between the cells, it will take hundreds of hours to balance the batteries through the passive battery balancing method above (the balancing circuit works with a certain duty cycle). Therefore, the passive equalization method is slow to equalize.

The balancing method of charge transfer through the second conversion circuit shown in FIG. 4-FIG. 7 directly changes the charging current of each cell in the battery pack for battery balancing, which can perform battery balancing efficiently and quickly.

Moreover, in this balancing method, the second conversion circuit is multiplexed, and the second conversion circuit 20 is used to supply power to the load 300. At the same time, it is used to realize the battery balancing function, and only the output of the second conversion circuit is connected to the power supply in the battery pack. The common nodes between the battery cells do not require additional devices. Compared to other active equalization methods, which requires more active devices, passive devices and control circuits, the proposed battery charging and discharging circuit offers lower cost, and the circuit is simpler.

Whether to perform battery balancing can be controlled by controlling the on and off of the first controllable switch. The first controllable switch can be controlled to be in an on state all the time, so that the battery is balanced throughout the entire charging and discharging process of the battery. The first controllable switch can also be controlled such that it is turned on for part of the time and turned off for part of the time, so that the battery is equalized during part of the charging and discharging time of the battery.

In some of these embodiments, when the first controllable switch starts to perform battery balancing, the first controllable switch may be controlled to operate in a constant current conduction mode to reduce the instantaneous current when the battery cell balancing starts. When the voltage difference between the terminals of the first controllable switch is smaller than a preset voltage difference threshold, the first controllable switch is controlled to be fully turned on. Taking the embodiment shown in FIG. 8 as an example, when the voltage difference between VSYS and the first common node is smaller than the preset voltage difference threshold, the first controllable switch is controlled to be completely turned on.

In a charging and discharging process of the terminal device, the charging process can be divided into three stages, namely a pre-charging stage, a constant-current charging stage, and a constant-voltage charging stage. In terminal devices that support fast charging, the constant current charging stage and the constant voltage charging also include the fast charging stage.

The first controllable switch 30 may be turned on in the discharge stage of the battery pack and the above-mentioned pre-charge stage, constant current stage and constant voltage stage, so that the battery is balanced throughout the entire charge and discharge stages of the battery pack. The first controllable switch 30 may also be turned on only in some stages. For example, the first controllable switch 30 is turned on during the discharge stage, the constant current charging stage and the constant voltage charging stage of the battery pack. While the first controllable switch 30 is turned off during the pre-charging stage. That is, voltage equalization is performed only in the discharge stage, the constant current charging stage, and the constant voltage charging stage of the battery pack.

In some of these embodiments, if the battery pack is in a discharge state, in the case where the second conversion circuit 20 adopts a charge pump circuit, since the efficiency of the charge pump circuit is not high at light load (i.e. when the terminal device is in a standby or light load state), the charge pump circuit can be turned off, and the load 300 can be powered by the battery cell connected to the ground alone. Taking the embodiment shown in FIG. 6 as an example, when the second conversion circuit 20 is turned off, the battery cell 202 supplies power to the load 300 independently through the first controllable switch 30.

That is, when the battery pack is in the discharge state, if the output current of the second conversion circuit 20 is greater than or equal to a preset current threshold (indicating that the terminal device is in a heavy load state), the first controllable switch 30 is turned on. The second conversion circuit 20 performs battery balancing for each cell in the battery pack while supplying power to the load. Of course, at this stage, the second controllable switch 30 can also be turned off without performing cell balancing.

If the output current of the second conversion circuit 20 is less than the preset current threshold (indicating that the terminal device is in a standby or light-load state), the first controllable switch 30 is turned on, and the second conversion circuit 20 is turned off, so as to improve the power supply efficiency, until the voltage difference between the series-connected cells is greater than or equal to a preset threshold. At this time, the second conversion circuit is activated to perform battery balancing until the voltage difference between the cells is smaller than the preset threshold, and the second conversion circuit is turned off again.

The voltage of each series-connected cell in the battery pack is detected in real time by the battery measurement and the battery protection controller 51 to determine whether the voltage difference between the cells is greater than or equal to the preset threshold.

This method is different from the method of using multiple cells in series to supply power to the load at the same time. The charge pump circuit does not operate continuously in the low current mode with low efficiency, but intermittently operates in the high current mode with higher efficiency for a short time to realize the transfer of charge between the cells and turn off the rest of the time to save energy. This approach achieves optimal efficiency when the battery pack supplies power to the load.

Taking the embodiment shown in FIG. 8 as an example, in the embodiment shown in FIG. 8, the second conversion circuit 20 is a charge pump circuit. Assuming that the terminal device is in a standby or light load state. It is assumed that the voltage across the battery cell 201 is VBAT2, and the voltage across the battery cell 202 is VBAT1.

When the discharge starts initially, the second conversion circuit 20 is turned off, and the battery cell 202 supplies power to the load through the first controllable switch 30 that is turned on. The voltage across the cell 202 is reduced to VBAT1=VBAT2 −ΔV1.

When the voltage difference ΔV1 between the battery cell 201 and the battery cell 202 is greater than the preset threshold, the second conversion circuit 20 is activated. Taking the single-phase charge pump circuit comprising the switches 26-29 in the second conversion circuit 20 as an example, the switch 26 and 28 are turned on first, and switches 27 and 29 are turned off. At this time, the battery cell 201 is connected in parallel with the capacitor C2 through the first controllable switch 30 to charge the capacitor C2 to the voltage across the battery cell 201 (VBAT2).

Then the switches 26 and 28 are turned off, the switches 27 and 29 are turned on, and the capacitor C2 is connected in parallel with the output capacitor Cout and VSYS. Since the voltage VBAT2 on the capacitor C2 is higher than VBAT1, the capacitor C2 also charges the battery cell 202 through the first controllable switch in addition to providing the full current for VSYS. When the current supplied to the load by the charge pump circuit is very small, the charge pump circuit is mainly used to transfer the charge on the battery cell 201 to the battery cell 202. The transfer current is controlled by the first controllable switch 30 and can be much larger than the current supplied to the load, so the efficiency of the charge pump is significantly improved at lower currents. Here, the first controllable switch can be configured to operate in a constant current conduction mode to limit the battery balancing current between the two cells, so as to prevent the voltage difference from causing excessive transient current and causing unnecessary losses.

After some time, the voltages of the battery cells 201 and 202 are gradually balanced until the voltage difference ΔV1 is smaller than the preset threshold. The charge pump circuit is turned off, and the cells 202 continue to discharge to supply power to the load by itself.

In some embodiments, please refer to FIG. 8, the battery charging and discharging circuit 100 may further include a configuration switch 40, a charging switch 60 and a discharging switch 70. The charging switch 60 is used to control the battery pack to start or stop charging, and the discharge switch 70 is used to control the battery pack to start or stop discharging. The configuration switch is used to control the charging and discharging parameters during the charging or discharging of the battery, such as controlling the charging current.

The charging switch 60 and the discharging switch 70 are, for example, MOS transistors, IGBT transistors, etc., and the configuration switch 40 is, for example, a linear regulator.

In some embodiments, the charging process of the terminal device includes a pre-charging phase. The first controllable switch 30 may be kept in an off state during the pre-charging phase, that is, no battery balancing is performed.

Usually, when the battery pack starts to charge, due to the low voltage of the battery pack, in order to protect the battery pack and avoid damaging to the battery cells caused by high current, the battery pack will be pre-charged with a small current first.

When the terminal device is connected to the external power supply and starts charging, the first conversion circuit converts the input voltage of the external power supply. For example, it is converted into about twice the minimum voltage required by the load. The configuration switch (for example, the configuration switch 40 in FIG. 8) between the battery pack and the external power supply controls the charging current. For example, the configuration switch can be operated in a linear voltage regulation state to output the pre-charge voltage and current to the battery pack.

In the pre-charging stage, the charging voltage provided by the first conversion circuit 10 is greater than the voltage of the battery pack. At this time, the configuration switch 40 will bear a certain voltage drop, and the input voltage of the second conversion circuit 20 is not equal to the voltage of the battery pack. As a result, the error of the above-mentioned battery balancing method may be relatively large. Hence, in the pre-charging stage, the first controllable switch 30 may be turned off and the battery balancing is not performed.

The battery balancing method during the charging process of the battery pack is described below by taking FIG. 8 as an example. The fast-charging mode provided in the embodiment of FIG. 8 is a fast-charging mode in which the power output from the adapter directly charges the battery pack by controlling the load switch 80 to be turned on by the high-voltage direct charging controller. The system controls the terminal device to enter the normal charging mode through a path switch (e.g., a USB protection chip), and the first conversion circuit 10 converts the output of the adapter to charge the battery pack.

In the discharging stage, when the terminal device is not connected to an external power supply, the battery cells 201 and 202 are in a fully discharged state, and the first controllable switch 30 can be kept on or off.

In the pre-charging stage, for example, the external power supply may be a voltage-adjustable AC power adapter. When the adapter that supports high-voltage voltage regulation starts to supply power to the VBUS port, the first conversion circuit 10 adjusts the input voltage of the adapter, for example, to about twice the minimum voltage required by the load. The configuration switch 40 outputs the battery pre-charge voltage and current to charge the battery pack in a linear regulation state. Then, the second conversion circuit 20 is turned on to supply power to the load. As the battery pack voltage increases, the configuration switches 40 are fully turned on in a gradual manner, and the constant current charging mode starts. During the pre-charging phase, the first controllable switch 30 remains off.

In the constant current charging stage, after the constant current charging starts, the first controllable switch is controlled to be gradually turned on to enable active battery balancing. In a specific application, the first controllable switch 30 may be configured to be in a constant current conduction state first, so as to reduce the instantaneous current between the first common node and VSYS, and wait until the voltage difference between the first common node and VSYS is sufficiently small. Then, it is fully turned on to achieve fast equalization between batteries at a faster rate. In the constant current phase, in order to keep the charging current constant, the output of the first conversion circuit increases as the battery voltage VBAT of the battery pack increases.

When the battery voltage of the battery pack reaches the super-fast charging threshold, the load switch 80 is turned on, and the path switch is turned off. The adjustable voltage adapter directly charges the battery pack, and simultaneously supplies power to the load through the second conversion circuit. In practical applications, at this stage, the output voltage of the adapter can be controlled by the high-voltage direct charging controller, which increases the voltage with the increase of the battery pack voltage to maintain a constant high current to charge the battery. The first controllable switch 30 is kept in an on state to achieve active balancing of the battery during the fast-charging process.

In the constant voltage charging stage, as the battery pack voltage VBAT continues to rise, when it reaches the constant voltage charging threshold, the terminal device enters the constant voltage charging stage. The adapter continues to provide a stable input voltage to the battery through the load switch 80 and makes fine adjustments to keep VBAT stable as the battery pack voltage changes. At this stage, the battery charging current is gradually reduced until the voltage regulation accuracy is not enough to maintain the constant voltage charging voltage. The path switch is turned back on. The load switch 80 is turned off, and the first conversion circuit is restarted to provide a stable VBAT for the load, until the charging current decreases to the charging stop threshold current, and charging stops. During the constant voltage charging stage, the first controllable switch 30 is kept on, and the second conversion circuit 20 continues to actively balance the battery pack.

In the above-mentioned constant current charging stage and constant voltage charging stage, the first controllable switch may not always be in an on state, but in a dynamic on or off state according to the voltage difference between the cells. For example, when the voltage difference between the battery cells is greater than a preset threshold, the first controllable switch is in a conducting state to perform battery balancing. When the voltage difference between the cells is smaller than the preset threshold, the first controllable switch is in an off state, and no cell balancing is performed.

Figure 10:
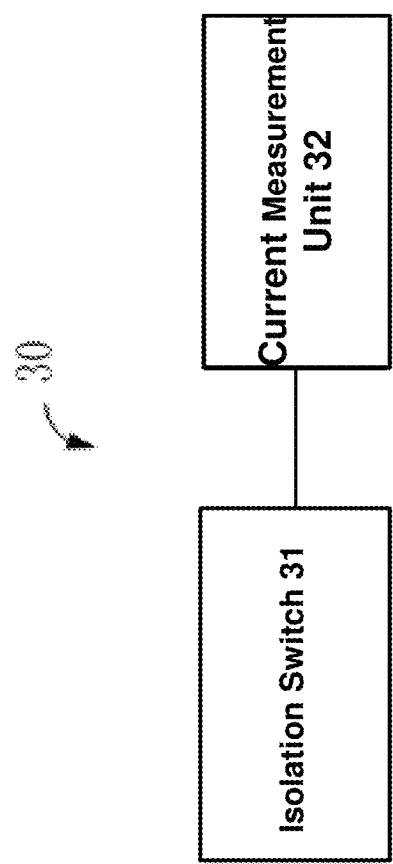
FIG. 10 is a schematic diagram of a first controllable switch in a battery charging and discharging circuit provided by an embodiment of the present invention.

In other embodiments, as shown in FIG. 10, the first controllable switch 30 includes an isolation switch 31 and a current measurement unit 32. The current measurement unit 32 is used to measure the current flowing through the isolation switch, and the current can be used to accurately measure the state of charge (SOC State of Charge) of the battery cell 202, thereby accurately estimating the power of the battery. For example, the current measured by the current measurement unit 32 and the series current measured on the current detection resistor 52 can be combined to achieve an accurate charge calculation of the battery cells 202 for more accurate and independent estimation of the charge status of the battery cells 202.

From the description of the above embodiments, those skilled in the art can clearly understand that each embodiment can be implemented by means of software plus a general hardware platform, and certainly can also be implemented by hardware. Based on this understanding, the above-mentioned technical solutions can be embodied in the form of software products in essence, or the parts that make contributions to related technologies, and the computer software products can be stored in computer-readable storage media, such as ROM/RAM, magnetic disks, optical disc, etc., including several instructions to cause a computer device (which may be a personal computer, a server, or a network device, etc.) to perform the methods described in various embodiments or some parts of the embodiments.

Finally, it should be noted that the above embodiments are only used to illustrate the technical solutions of the present invention, but not to limit them; under the idea of the present invention, the technical features in the above embodiments or different embodiments can also be combined. The steps may be carried out in any order, and there are many other variations of the different aspects of the invention as described above, which are not provided in detail for the sake of brevity; although the invention has been recorded in the foregoing embodiments, skilled person should understand that it is still possible to modify the technical solutions, or to perform equivalent replacements on some of the technical features; and these modifications or replacements do not make the essence of the corresponding technical solutions deviate from the scope of technical solutions of implementation of the present invention.

What is claimed is:

1. A battery charging and discharging circuit used for charging and discharging a battery pack comprising N cells connected in series, the battery charging and discharging circuit comprising:
   a first conversion circuit and a second conversion circuit, wherein:
      an input terminal of the first conversion circuit is used to connect to an external power supply;
      an output terminal of the first conversion circuit is connected to an input terminal of the second conversion circuit and a first terminal of the battery pack;
   a second terminal of the battery pack is grounded;
   the N cells have N-1 common nodes, and the common nodes are common connection points of two adjacent cells;
   the second conversion circuit has N-1 output terminals, wherein:
      a step-down ratio of the second conversion circuit is a fixed value;
      an Mth output terminal is used to output a voltage equal to M/Nth of an input voltage; and
      a first output terminal is also used to supply power to a load; and
   each one of the common nodes of the N cells, in the order from the second terminal to the first terminal of the battery pack, is connected to one of the output terminals of the second conversion circuit in the order from low voltage to high voltage, and wherein N is greater than or equal to 2.

2. The battery charging and discharging circuit of claim 1, wherein:
the charging and discharging circuit further comprises a first controllable switch comprising an isolating switch and a current measuring unit, and wherein the current measuring unit is used to measure a current flowing through the isolating switch.

3. The battery charging and discharging circuit of claim 1, wherein:
the charging and discharging circuit further comprises a first controllable switch, and wherein each of the common nodes of the battery pack is connected to an output of the second conversion circuit through the first controllable switch.

4. The battery charging and discharging circuit of claim 3, wherein:
the battery pack comprises a first cell and a second cell connected in series, and the first cell and the second cell have a first common node; and
a step-down ratio of the second conversion circuit is 2:1; and
the first output terminal of the second conversion circuit is used to output ½ of the input voltage, and wherein the first output terminal of the second conversion circuit is connected to the first common node through the first controllable switch, and the first output terminal of the second conversion circuit is also used supplying power to the load.

5. The battery charging and discharging circuit of claim 3, wherein:
the battery pack comprises a first cell, a second cell and a third cell connected in series;
one terminal of the third cell is grounded;
the third cell and the second cell have a first common node, and the second cell and the first cell have a second common node; and
the second conversion circuit has the first output terminal and a second output terminal, and wherein:
a step-down ratio of the second conversion circuit is 3:1;
the first output terminal of the second conversion circuit is used to output ⅓ of the input voltage; and
the second output terminal of the second conversion circuit is used to output ⅔ of the input voltage;
the first output terminal of the second conversion circuit is connected to the first common node through the first controllable switch;
the second output terminal of the second conversion circuit is connected to the second common node through another first controllable switch; and
the first output terminal of the second conversion circuit is also used to supply power to the load.

6. The battery charging and discharging circuit of claim 3, wherein:
a control terminal of the first controllable switch is connected to a first controller; and
the first controller is used to control the first controllable switch to turn on or off a connection between a common node and a corresponding output terminal of the second conversion circuit.

7. The battery charging and discharging circuit of claim 6, wherein the first controller is configured to:
control the first controllable switch to be turned on when an external power source does not provide power to the battery pack, the battery pack is in a discharging state, and an output current of the second conversion circuit is less than a preset current threshold; and
turn off the second conversion circuit when a voltage difference between cells is less than a preset threshold, and activate the second conversion circuit when the voltage difference between the cells is greater than or equal to the preset threshold.

8. The battery charging and discharging circuit of claim 6, wherein:
the first controller is configured to control the first controllable switch to be turned on when the battery pack is in a constant current charging state.

9. The battery charging and discharging circuit of claim 8, wherein controlling the first controllable switch to be turned on comprises:
when the first controllable switch is switched from an off state to an on state, the first controllable switch is first controlled to operate in a constant current conduction mode; and
when a voltage difference between two terminals of the first controllable switch is less than a predetermined value, the first controllable switch is controlled to be in a fully conducting state.

10. The battery charging and discharging circuit of claim 8, wherein:
the first controller is further configured to control the first controllable switch to be turned off when the battery pack is in a pre-charge state.

11. The battery charging and discharging circuit of claim 10, wherein:
the first controller is further configured to control the first controllable switch to be turned on when the battery pack is in a constant voltage charging state.

* * * * *